US009681558B2

(12) United States Patent
Chen et al.

(10) Patent No.: US 9,681,558 B2
(45) Date of Patent: Jun. 13, 2017

(54) MODULE WITH INTEGRATED POWER ELECTRONIC CIRCUITRY AND LOGIC CIRCUITRY

(71) Applicant: Infineon Technologies AG, Neubiberg (DE)

(72) Inventors: Liu Chen, Munich (DE); Markus Dinkel, Unterhaching (DE); Toni Salminen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 151 days.

(21) Appl. No.: 14/457,663

(22) Filed: Aug. 12, 2014

(65) Prior Publication Data

US 2016/0050768 A1 Feb. 18, 2016

(51) Int. Cl.
*H05K 7/00* (2006.01)
*H05K 3/40* (2006.01)
(Continued)

(52) U.S. Cl.
CPC .......... *H05K 3/40* (2013.01); *H05K 3/4697* (2013.01); *H05K 7/06* (2013.01); *H01L 2224/18* (2013.01);
(Continued)

(58) Field of Classification Search
CPC ........ H05K 1/185; H05K 3/40; H05K 3/4697; H05K 7/06; H05K 2201/10166;
(Continued)

(56) References Cited

U.S. PATENT DOCUMENTS 6,882,538 B1 * 4/2005 Frisch ................... H01L 25/162
174/252
7,489,839 B2 * 2/2009 Kim ......................... G02B 6/43
385/14
(Continued)

FOREIGN PATENT DOCUMENTS

DE 19924991 A1 12/2000
DE 10048379 A1 4/2001
(Continued)

OTHER PUBLICATIONS

Infineon Technologies AG, "Recommendations for Printed Circuit Board Assembly of Infineon Laminate Packages", Additional Information, Infineon Technologies AG, 81726, Munich, Germany, Edition 2012-032, www.infineon.com, pp. 1-16.
(Continued)

*Primary Examiner* — Courtney Smith
*Assistant Examiner* — Sagar Shrestha
(74) *Attorney, Agent, or Firm* — Murphy, Bilak & Homiller, PLLC

(57) ABSTRACT

A integrated power module with integrated power electronic circuitry and logic circuitry includes an embedded power semiconductor module including one or more power semiconductor dies embedded in a dielectric material, a multilayer logic printed circuit board with one or more logic dies mounted to a surface of the logic printed circuit board, and a flexible connection integrally formed between the embedded power semiconductor module and the logic printed circuit board. The flexible connection mechanically connects the embedded power semiconductor module to the logic printed circuit board and provides an electrical pathway between the embedded power semiconductor module and the logic printed circuit board. A method of manufacturing the integrated power module is also provided.

13 Claims, 11 Drawing Sheets

(51) Int. Cl.
*H05K 7/06* (2006.01)
*H05K 3/46* (2006.01)
*H05K 3/00* (2006.01)

(52) U.S. Cl.
CPC . *H05K 3/0017* (2013.01); *H05K 2201/10166* (2013.01)

(58) Field of Classification Search
CPC ........ H05K 3/0017; H05K 1/14; H05K 1/142; H05K 1/145; H05K 1/147; H05K 1/148; H01L 2224/18
USPC ..... 361/679.01, 679.02, 728, 729, 736, 746, 361/749, 766, 761, 762, 785, 792, 803; 174/254; 257/777, 778
See application file for complete search history.

(56) References Cited

U.S. PATENT DOCUMENTS

| | | | |
|---|---|---|---|
| 8,030,131 | B2 | 10/2011 | Otremba et al. |
| 8,648,473 | B2 | 2/2014 | Prueckl |
| 8,658,904 | B2 * | 2/2014 | Naganuma ............. H05K 1/115 174/255 |
| 9,320,137 | B2 * | 4/2016 | Kim ....................... H05K 1/188 |
| 2004/0121266 | A1 * | 6/2004 | Lee ......................... H05K 1/162 430/313 |
| 2005/0207133 | A1 * | 9/2005 | Pavier .................... H05K 1/141 361/761 |
| 2005/0231889 | A1 * | 10/2005 | Tsuji ...................... H01G 4/232 361/306.2 |
| 2006/0170098 | A1 * | 8/2006 | Hsu ...................... H01L 23/5389 257/723 |
| 2006/0249754 | A1 * | 11/2006 | Forman ............... H01L 21/6835 257/208 |
| 2008/0047737 | A1 * | 2/2008 | Sahara ................... H05K 1/186 174/254 |
| 2008/0272829 | A1 * | 11/2008 | Maeda ................ H01L 23/5389 327/518 |
| 2009/0031062 | A1 | 1/2009 | Shen et al. |
| 2009/0046437 | A1 | 2/2009 | Hsieh et al. |
| 2009/0115047 | A1 | 5/2009 | Haba et al. |
| 2009/0296330 | A1 * | 12/2009 | Ho ............................ G06F 1/18 361/679.4 |
| 2010/0020515 | A1 | 1/2010 | Rubino et al. |
| 2010/0025087 | A1 * | 2/2010 | Takahashi ............ H05K 3/4691 174/254 |
| 2012/0181706 | A1 | 7/2012 | Zeng et al. |
| 2013/0220535 | A1 * | 8/2013 | Lee ....................... H05K 3/4691 156/268 |
| 2013/0329374 | A1 | 12/2013 | Lin et al. |
| 2015/0255418 | A1 * | 9/2015 | Gowda ................... H01L 24/19 257/690 |
| 2016/0079133 | A1 | 3/2016 | Nashida et al. |

FOREIGN PATENT DOCUMENTS

| | | |
|---|---|---|
| DE | 10214953 A1 | 10/2003 |
| DE | 10244365 A1 | 4/2004 |
| DE | 102005061016 A1 | 6/2007 |
| DE | 102006056363 A1 | 6/2008 |
| DE | 102008052029 A1 | 6/2009 |
| DE | 102009032995 A1 | 3/2010 |
| DE | 102011105346 A1 | 12/2012 |
| DE | 102011113255 A1 | 3/2013 |
| EP | 2538761 A1 | 12/2012 |
| WO | 2012175207 A2 | 12/2012 |
| WO | 2013085992 A2 | 6/2013 |

OTHER PUBLICATIONS

Schweizer Electronic, "Products and Solutions", Schweizer Electronic AG, 78713 Schramberg, Germany, Oct. 2012, pp. 1-12.
Schweizer Electronic, "Schweizer Inlay Board—the Secure and Reliable Inlay Technology", Schweizer Electronic AG, Oct. 2008, pp. 1.
Schweizer Systems, "p2 Pack—the Power Embedding Solution", Increasing Packing Density and Thermal Performance with Minimized Parasitics for High Power Inverters, Schweiger Electronic AG, 78713 Schramberg, Germany, pp. 1-6.

* cited by examiner

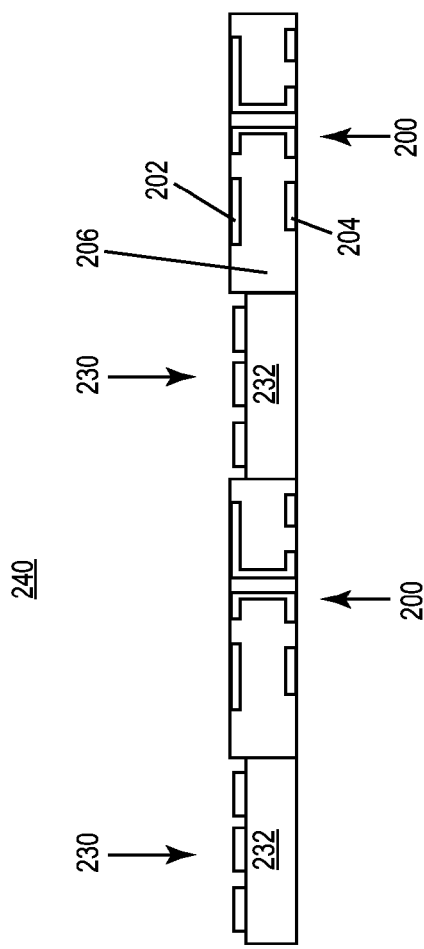
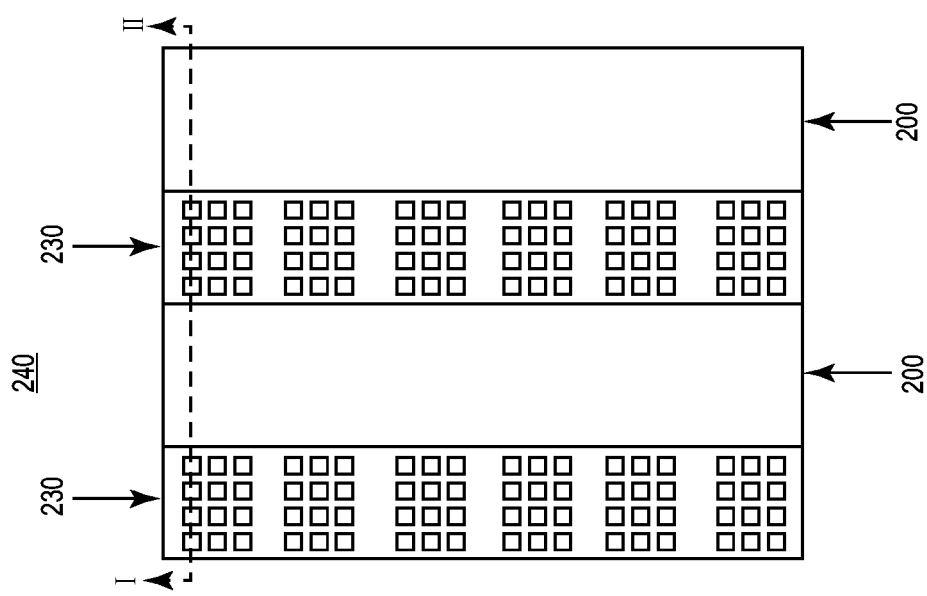
FIG. 4B
FIG. 4A

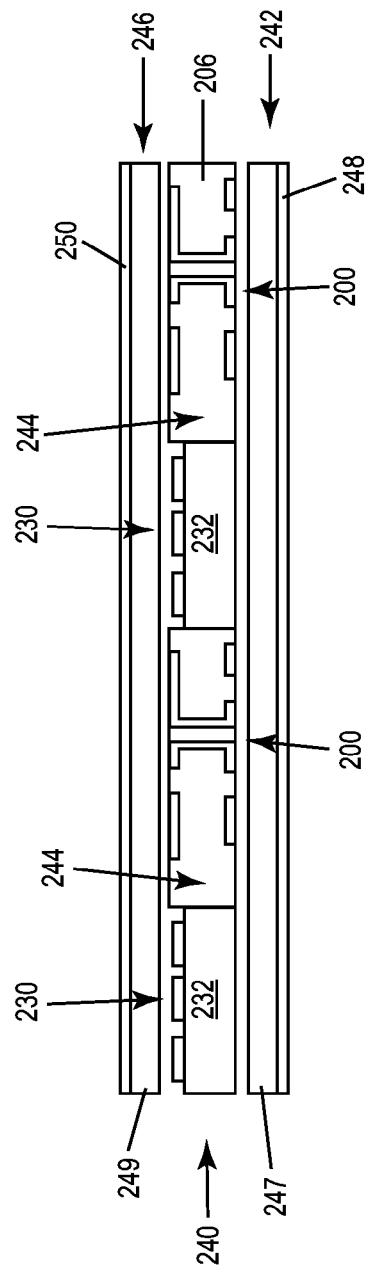
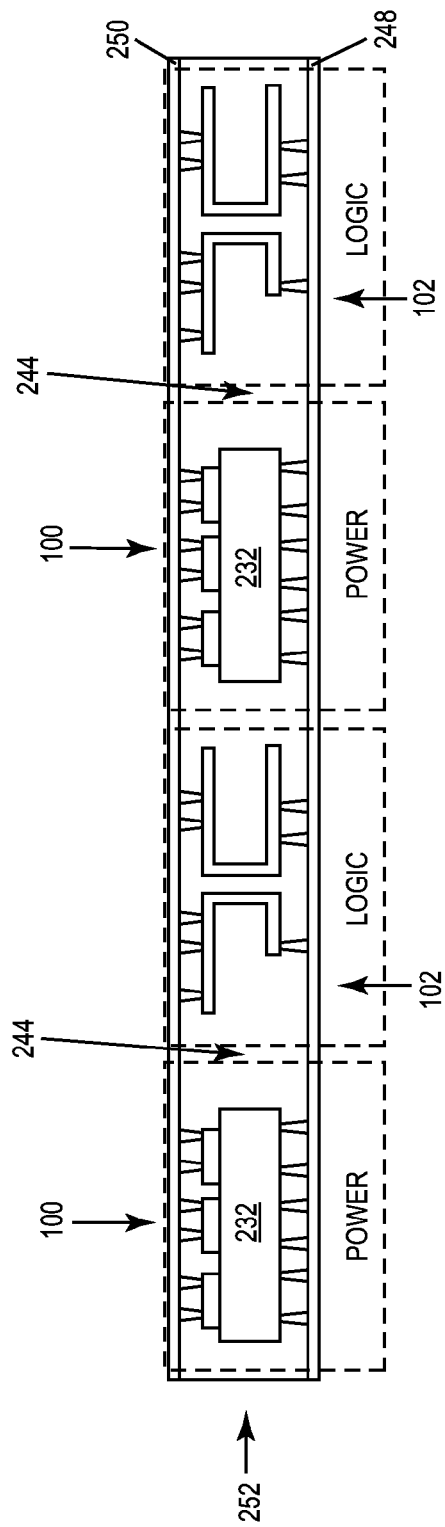

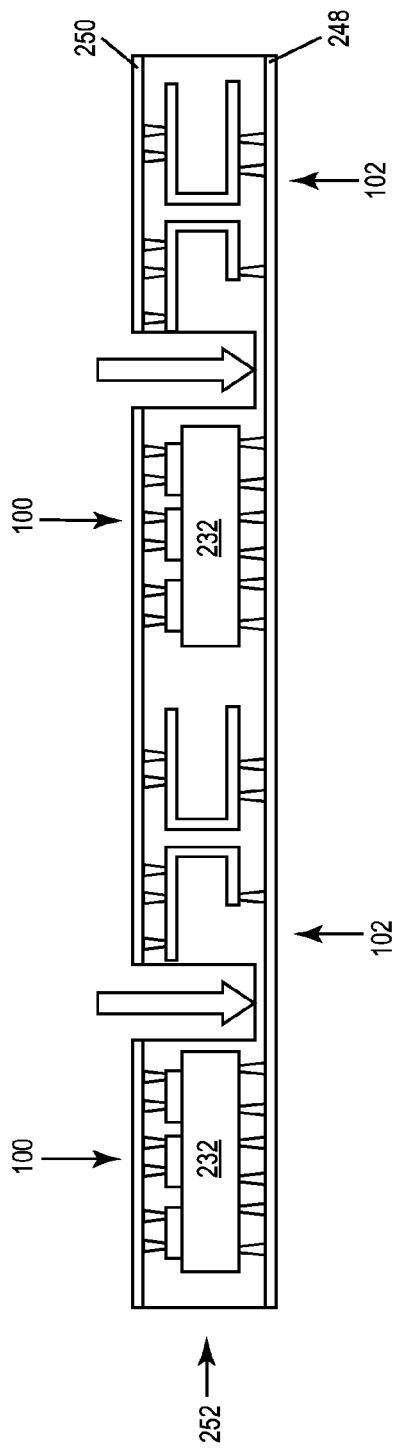
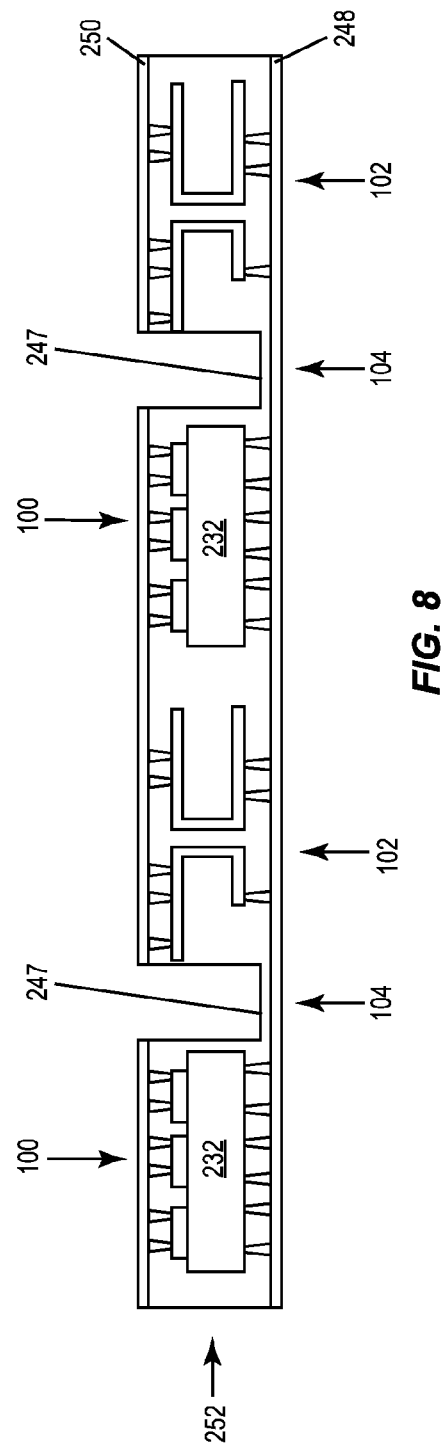

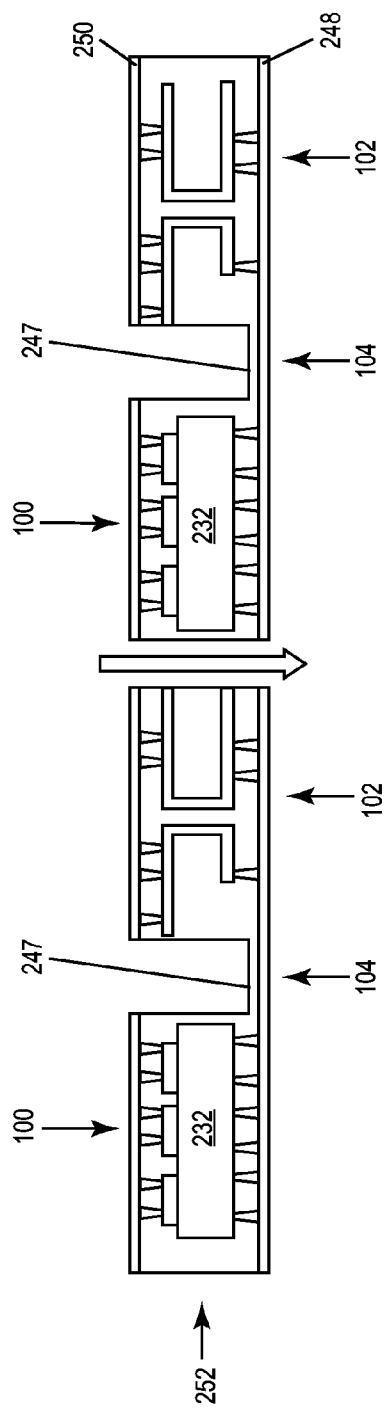
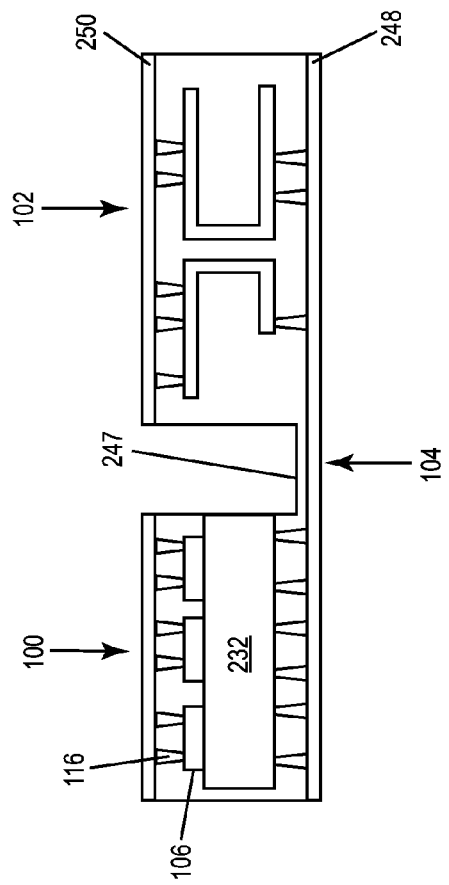
FIG. 9
FIG. 10

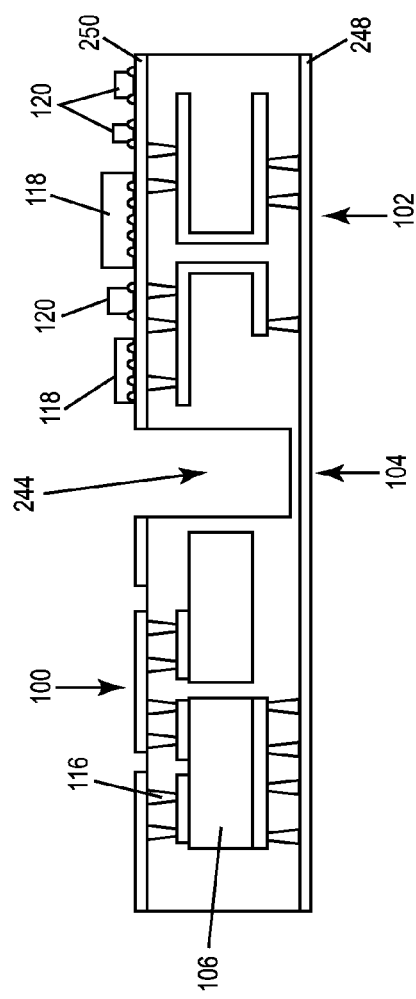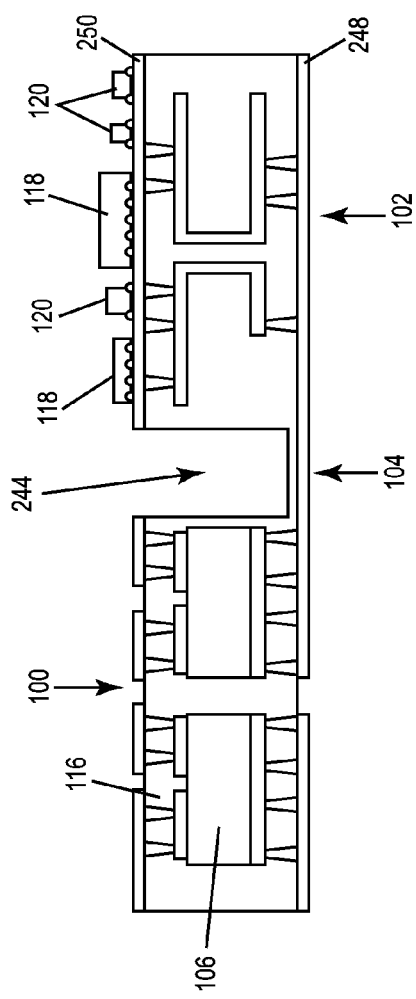

MODULE WITH INTEGRATED POWER ELECTRONIC CIRCUITRY AND LOGIC CIRCUITRY

TECHNICAL FIELD

The present application relates to power electronic circuitry, in particular integrating power electronic circuitry with the logic circuitry that controls operation of the power circuitry.

BACKGROUND

Many applications such as automotive and industrial applications utilize power electronic circuitry such as IGBTs (insulated gate bipolar transistors), power MOSFETs (metal oxide semiconductor field effect transistors), power diodes, etc. For example, common power circuits include single and multi-phase half-wave rectifiers, single and multi-phase full-wave rectifiers, voltage regulators, etc. Integrated power modules (IPMs) include both power electronic circuitry and the logic circuitry for controlling operation of the power electronic circuitry. In some conventional IPMs, the power dies (chips) are attached to a power electronic substrate such as a DBC (direct bonded copper), IMS (insulated metal substrate) or AMB (active metal brazed) substrate. The logic dies are surface mounted to a separate logic printed circuit board. The power electronic substrate is then connected to the logic printed circuit board by a rigid connector. In other conventional IPMs, the connection mechanism is not as bulky. However, the power dies are typically surface mounted to a second printed circuit board. In both IPM implementations, significant area is needed to accommodate the various parts, increasing the overall size and cost of the IPM. Other conventional IPMs inlay a power semiconductor module within the logic printed circuit board. While this approach reduces the area needed to implement the IPM, it has significantly more process steps and is costly. As such, a smaller, simpler, and more cost-effective IPM solution is needed.

SUMMARY

According to an embodiment of a method of interconnecting power electronic circuitry with logic circuitry, the method comprises: providing a multi-layer logic printed circuit board and an embedded power semiconductor module, the embedded power semiconductor module including one or more power semiconductor dies embedded in a dielectric material; mounting one or more logic dies to a surface of the logic printed circuit board; and forming an integral flexible connection between the embedded power semiconductor module and the logic printed circuit board, the integral flexible connection mechanically connecting the embedded power semiconductor module to the logic printed circuit board and providing an electrical pathway between the embedded power semiconductor module and the logic printed circuit board.

According to an embodiment of an integrated power module, the module comprises a embedded power semiconductor module including one or more power semiconductor dies embedded in a dielectric material, a multi-layer logic printed circuit board with one or more logic dies mounted to a surface of the logic printed circuit board, and a flexible connection integrally formed between the embedded power semiconductor module and the logic printed circuit board. The flexible connection mechanically connects the embedded power semiconductor module to the logic printed circuit board and provides an electrical pathway between the embedded power semiconductor module and the logic printed circuit board.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A through 3D, FIGS. 4A and 4B, and FIGS. 5 through 10 illustrate different stages of an embodiment of a method of interconnecting power electronic circuitry with logic circuitry using an integrated power module.

FIG. 11 illustrates a sectional view of another embodiment of an integrated power module that has a flexible connection integrally formed between an embedded power semiconductor module and a logic printed circuit board.

FIG. 12 illustrates a sectional view of yet another embodiment of an integrated power module that has a flexible connection integrally formed between an embedded power semiconductor module and a logic printed circuit board.

DETAILED DESCRIPTION

The embodiments described herein provide an IPM (integrated power module) with a flexible connection integrally formed between an embedded power semiconductor module and a logic printed circuit board (PCB). PCBs mechanically support and electrically connect electronic components using conductive tracks (traces), pads and other features etched from copper sheets (foils) laminated onto a non-conductive substrate material. PCBs can be single-sided (e.g. one copper layer), double-sided (e.g. two copper layers) or multi-layer. Conductors on different layers are connected with plated-through hole vias, laser drilled micro-vias, conductive paste vias (e.g. ALIVH, $B^2$it), etc. Advanced PCBs can contain components such as capacitors, resistors or active devices, embedded in the PCB resin material and/or mounted to a surface of the PCB. In each case, the logic PCB of the IPM includes logic circuitry for controlling the power circuitry of the embedded power semiconductor module. The flexible connection of the IPM mechanically connects the embedded power semiconductor module to the logic printed circuit board, and provides an electrical pathway between the embedded power semiconductor module and the logic printed circuit board. The IPM solution described herein allows for combining high-density logic PCB with embedded power technology e.g. by using flexible interconnection technology such as flexible FR-4, flexible PCB technology, flexible printed circuit (FCP) technology, etc.

Figure 1:
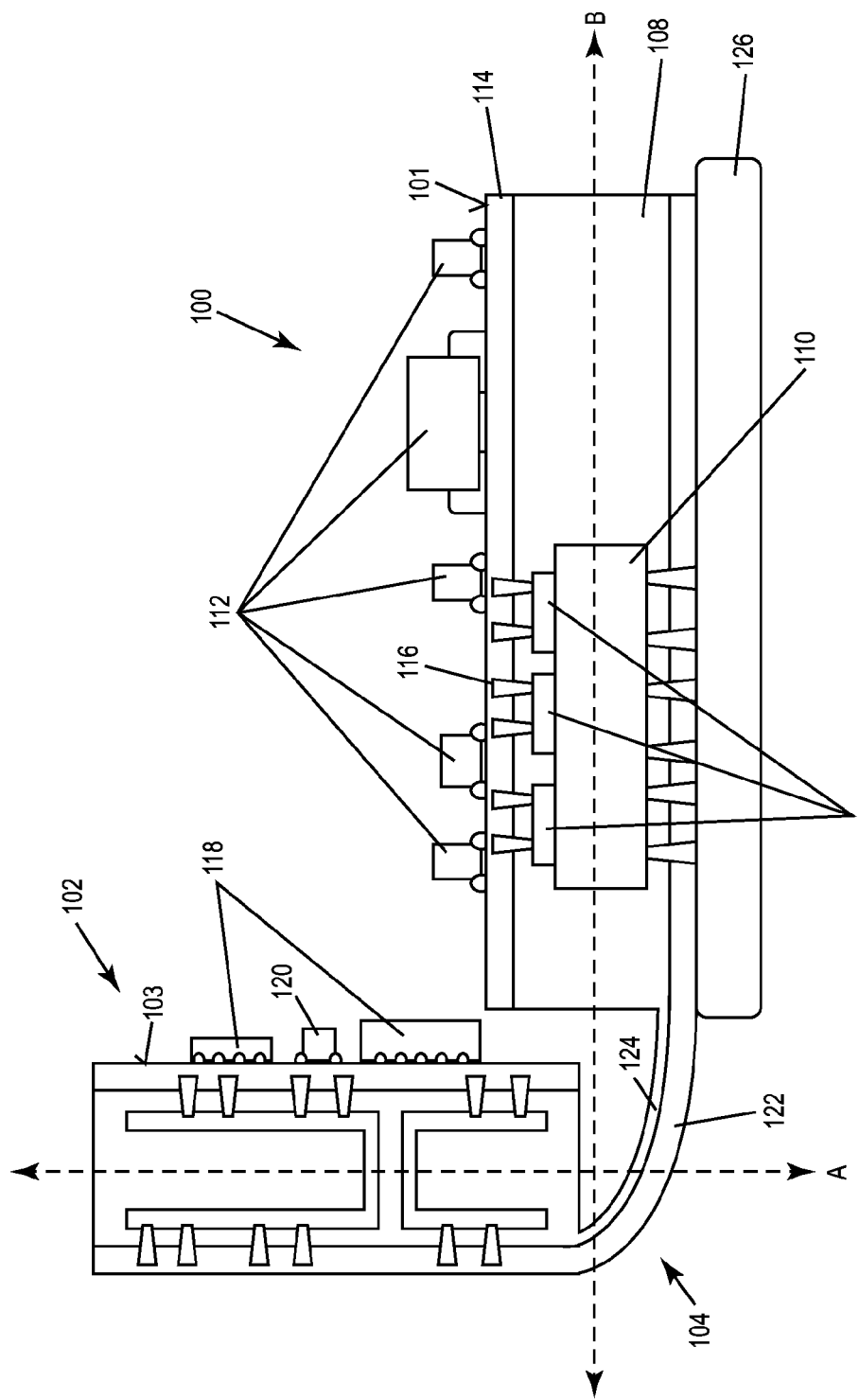
FIG. 1 illustrates a sectional view of an embodiment of an integrated power module that has a flexible connection integrally formed between an embedded power semiconductor module and a logic printed circuit board.

FIG. 1 illustrates a sectional view of an embodiment of an IPM. According to this embodiment, the IPM comprises an embedded power semiconductor module 100, a multi-layer logic printed circuit board (PCB) 102, and a flexible connection 104 integrally formed between the embedded power semiconductor module 100 and the logic PCB 102. The power semiconductor module 100 is an 'embedded module' in that the module 100 includes one or more power semiconductor dies 106 embedded in a dielectric material 108. The power semiconductor die(s) 106 included in the power semiconductor module 100 can include any type of power semiconductor device(s) such as vertical current power transistors, lateral power transistors, discrete and smart power transistors, power diodes, etc. In one embodiment, the embedded power semiconductor module 100 includes a metal block 110 to which the power semiconductor die(s) 106 are attached. The metal block 110 and power semiconductor die(s) 106 are embedded in the dielectric material 108. In one embodiment, the dielectric material 108 of the power semiconductor module 100 is formed as part of a lamination process used to fabricate the IPM. In another embodiment, the embedded power semiconductor module 100 is inlaid into the logic PCB 102 during PCB processing. Still other types of embedded power semiconductor modules can be used.

Additional active and/or passive components 112 can be mounted to a surface 101 of the embedded power semiconductor module 100. The additional components 112 can be electrically connected to the power semiconductor die(s) 106 through a patterned metal foil 114 at the mounting surface 101 of the embedded power semiconductor module 100 and through conductive vias 116 which extend between the patterned metal foil 114 and the power semiconductor die(s) 106. In one embodiment, the IPM module is formed by a lamination process and the patterned metal foil 114 is part of an uppermost lamination substrate which is laminated onto the embedded power semiconductor module 100 and the multi-layer logic PCB 102. One or more logic dies 118 for controlling operation of the power semiconductor die(s) 106 and corresponding passive components 120 are mounted to an exterior surface 103 of the logic PCB 102. For example, the logic die(s) 118 and passive components 120 can be SMT (surface mount technology) devices. The logic die(s) 118 can include any type of electronic device for controlling operation of the power semiconductor die(s) 106 such as a controller, driver, etc.

In each case, the flexible connection 104 integrally formed between the embedded power semiconductor module 100 and the logic PCB 102 mechanically connects the embedded power semiconductor module 100 to the logic PCB 102 and also provides an electrical pathway between the embedded power semiconductor module 100 and the logic PCB 102. The flexible connection 104 is 'integrally formed' between the embedded power semiconductor module 100 and the logic PCB 102 in that the flexible connection 104 is not readily separable from the embedded power semiconductor module 100 or the logic PCB 102. Instead, the flexible connection 104 becomes an integral or constituent part of both the embedded power semiconductor module 100 and the logic PCB 102 during the IPM manufacturing process. In one embodiment the IPM is formed by a lamination process as described in more detail later herein, and the flexible connection 104 comprises a lamination substrate laminated to the embedded power semiconductor module 100 and the logic PCB 102. According to this embodiment, the electrical pathway provided by the integral flexible connection is formed by a metal foil 122 disposed on a dielectric material 124 of the lamination substrate. A heat sink or board 126 can be attached to the metal foil 122 under the embedded power semiconductor module 100 e.g. to improve heat dissipation in this region of the IPM or to provide a connection to another assembly.

In general, the integral flexible connection 104 can have one or more electrical connection layers formed e.g. by laminating a laminate and copper layer(s). The integral flexible connection 104 bridges a gap or space between the embedded power semiconductor module 100 and the logic PCB 102 and provides a flexible mechanical and electrical connection between the power module 100 and logic PCB 102. The integral flexible connection 104 can be bent in various configurations depending on the application in which the IPM is to be used. For example in FIG. 1, the integral flexible connection 104 is bent such that the logic PCB 102 lies in one plane (A) and the embedded power semiconductor module 100 lies in a different plane (B). In one embodiment, the flexible connection 104 is bent such that the plane A and plane B are perpendicular as shown in FIG. 1.

Figure 2:
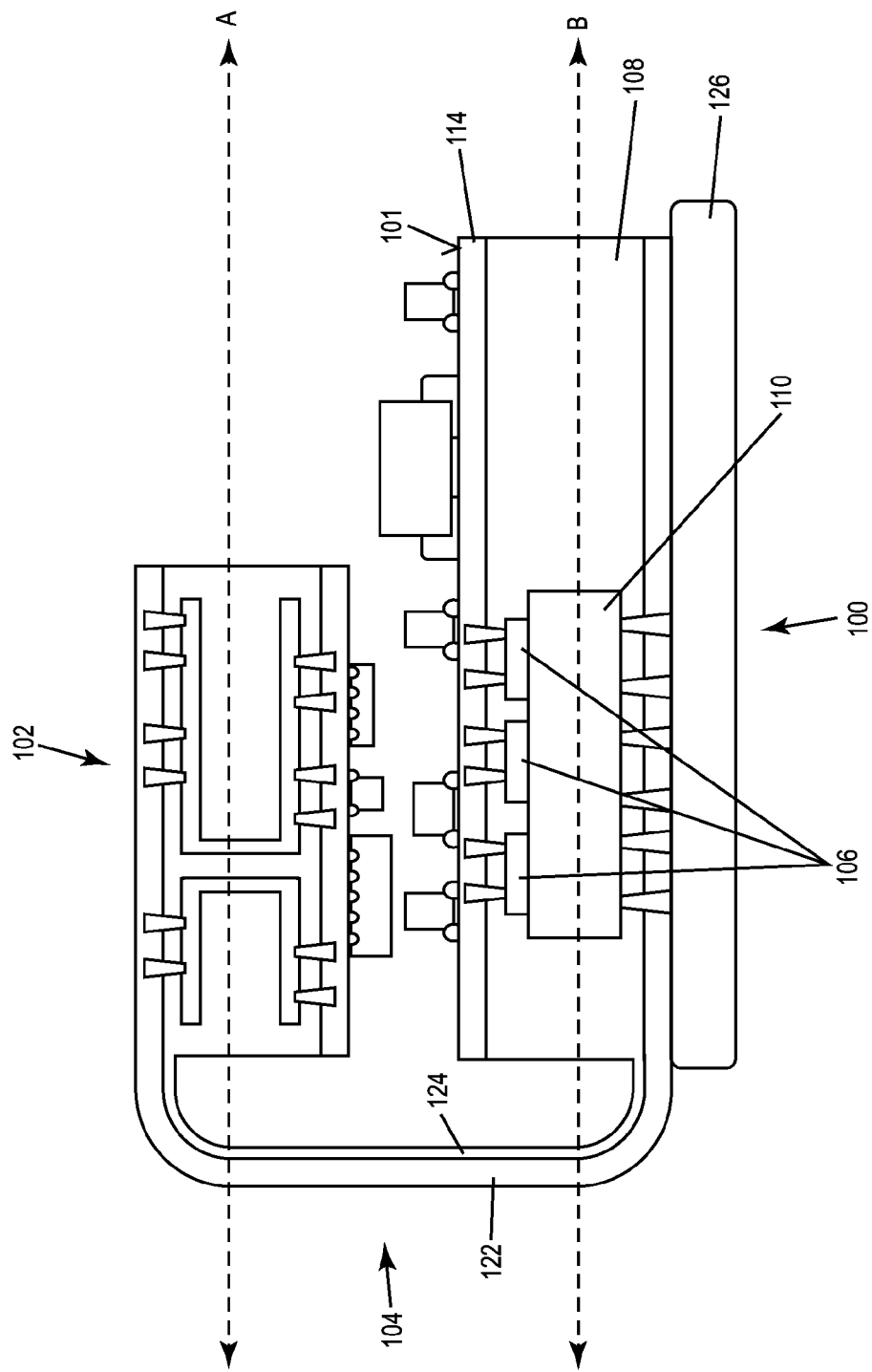
FIG. 2 illustrates a sectional view of another embodiment of an integrated power module that has a flexible connection integrally formed between an embedded power semiconductor module and a logic printed circuit board.

FIG. 2 illustrates a sectional view of another embodiment of the IPM. The embodiment shown in FIG. 2 is similar to the embodiment shown in FIG. 1. Different however, the integral flexible connection 104 is bent such that the logic PCB 102 is positioned over the embedded power semiconductor module 100. That is, plane A and plane B are parallel but spaced apart from one another. According to this embodiment, the flexible connection 104 is bent such that the logic die(s) 118 mounted to the surface 103 of the logic PCB 102 face toward the embedded power semiconductor module 100. In yet another embodiment, the integral flexible connection 104 is bent the opposite way as shown in FIG. 2 such that the logic PCB 102 is positioned under the embedded power semiconductor module 100 and the logic die(s) 118 mounted to the logic PCB 102 face away from the embedded power semiconductor module 100.

FIGS. 3 through 11 illustrate one embodiment of manufacturing the IPM shown in FIGS. 1 and 2. According to this embodiment, the integral flexible connection 104 between the embedded power semiconductor module 100 and the logic PCB 102 is formed by providing a laminate that includes the logic PCB 102 and the embedded power semiconductor module 100 interposed between first and second lamination substrates such that a dielectric-filled gap exists between the logic PCB 102 and the embedded power semiconductor module 100. The laminate is then thinned in a region of the dielectric-filled gap such that the thinned region of the laminate forms the integral flexible connection.

Figure 3A:
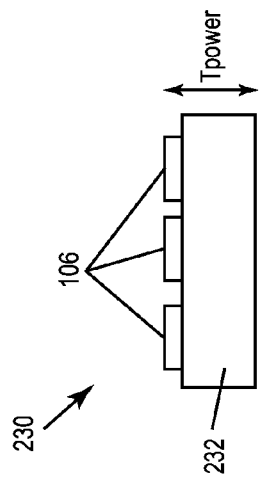
Figure 3C:
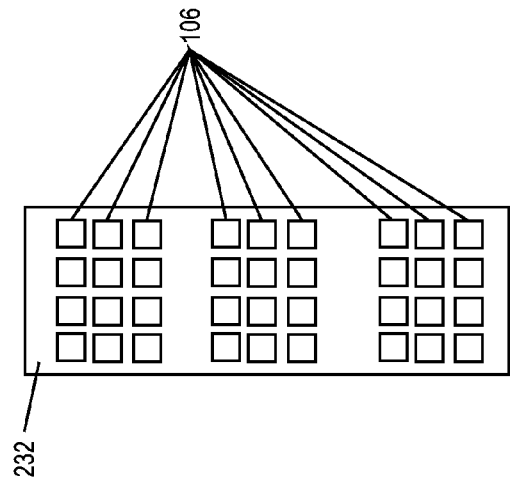
Figure 3B:
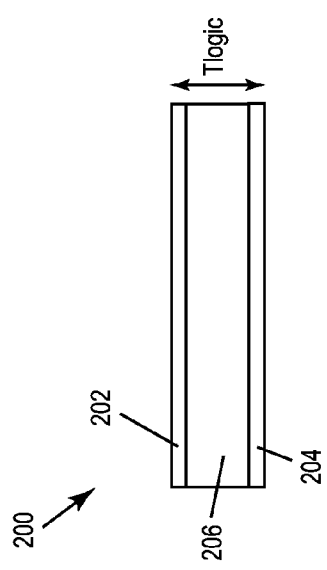
Figure 3D:
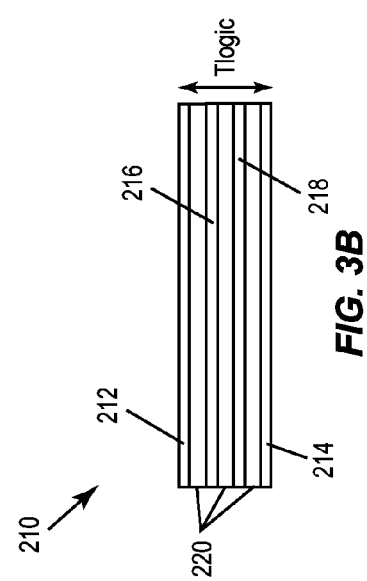

FIG. 3, which includes FIGS. 3A and 3D, illustrates different exemplary logic PCB and power module starting core materials for the IPM. FIG. 3A shows an exemplary 2-layer logic PCB core 200 which includes top and bottom metal foils 202, 204 such as copper foils and an intermediary resin-type dielectric material 206 such as polytetrafluoroethylene, FR-4, FR-1, CEM-1, CEM-3, polyimide, liquid crystal polymer, etc. FIG. 3B shows an exemplary 4-layer logic PCB core 210 which includes top and bottom metal foils 212, 214 such as copper foils and two intermediary metal foils 216, 216 separated by a resin-type dielectric material 218 such as polytetrafluoroethylene, FR-4, FR-1, CEM-1, CEM-3, polyimide, liquid crystal polymer, etc. The IPM manufacturing process is explained with reference to the exemplary 2-layer logic PCB core 200 shown in FIG. 3A for ease of illustration and explanation only. In general, any high-density logic PCB core can be used. FIG. 3C shows a side view of an exemplary power module core 230 for implementing the power semiconductor module 100, and FIG. 3D shows a corresponding top plan view. The power module core 230 includes a metal block 232 such as a copper block to which the power semiconductor die(s) 106 are attached. As shown in FIG. 3D, the power module core 230 can include power semiconductor dies 106 for more than one eventual IPM. The thickness (Tlogic) of the logic PCB core 200/210 is equal to the combined thickness (Tpower) of the metal block 232 and power semiconductor dies 106 of the power module core 230.

FIG. 4, which includes FIGS. 4A and 4B, shows the logic PCB cores 200 positioned adjacent the respective power module cores 230 to form a manufacturing panel 240 suitable for the subsequent processing steps. FIG. 4A shows a top plan view of the arrangement, and FIG. 4B shows a corresponding sectional view along the line labelled I-II in FIG. 4A.

FIG. 5 shows the panel 240 with the logic PCB cores 200 and the power module cores 230 being arranged on a first lamination substrate 242 such that a dielectric-filled gap 244 remains between the respective logic PCB cores 200 and the power module cores 230. According to this embodiment, the gap 244 between the logic PCB cores 200 and the power module cores 230 is filled with the dielectric material 206 of the logic PCB cores 200. A second lamination substrate 246 is similarly arranged on the logic PCB cores 200 and the power module cores 230 to form a stack that includes the logic PCB and power module cores 200, 230 interposed between the first and second lamination substrates 242, 246. The lamination substrates 242, 246 can include any standard dielectric 247, 249 such as polytetrafluoroethylene, FR-4, FR-1, CEM-1, CEM-3, polyimide, liquid crystal polymer, etc. laminated with respective metal foils 248, 250.

FIG. 6 shows the stack after lamination. Lamination involves placing the stack in a press and applying pressure and heat for a period of time. The lamination process results in an inseparable one-piece laminate 252, which can be drilled, plated, etched, etc. to form traces on the bottom and top metal foils 248, 250 of the laminate 252 as shown in FIG. 6. The power and logic sections are integrated together and formed from the different logic PCB and power module cores 200, 230 laminated together. In one embodiment, the metal foil 250 of the second lamination substrate 246 is etched to form contact pads for mounting the logic die(s) 118 to the surface 103 of the respective logic PCBs 102. The metal foil 250 of the second lamination substrate 246 can also be etched in a different region to form external connections on the respective embedded power semiconductor modules 100 for electrically connecting to the power semiconductor die(s) 106 embedded in each module 100. The metal foil 248 of the first lamination substrate 242 can also be etched to form electrically conductive traces for the integral flexible connection 104 between the embedded power semiconductor module 100 and the corresponding logic PCB 102 of each IPM.

FIG. 7 shows the laminate during formation of the integral flexible connections 104 between the respective embedded power semiconductor modules 100 and corresponding logic PCBs 102. Standard precision milling such as mechanical milling can be used for thinning the laminate 252 and forming the flexible connections 104 as indicated by the downward facing arrows in FIG. 7. For example, the laminate 542 can be thinned in the region of the dielectric-filled gap 244 between respective ones of the power semiconductor modules 100 and logic PCBs 102 by milling through the second lamination substrate 246 and the dielectric (resin) material 206 of the logic PCB cores 200 in the region of the dielectric-filled gaps 244.

FIG. 8 shows the laminate 252 after the integral flexible connections 104 are formed. According to this embodiment, at least some of the dielectric material 247 of the first lamination substrate 242 remains between respective ones of the power semiconductor modules 100 and logic PCBs 102. The remaining dielectric material 247 of the first lamination substrate 242 and the etched metal foil 248 of the first lamination substrate 242 form the integral flexible connection 104 between the embedded power semiconductor module 100 and the logic PCB 102 of each IPM. The electrical pathway provided by each integral flexible connection 104 is formed by the etched metal (e.g. copper) foil 248 of the first lamination substrate 242.

FIG. 9 shows the laminate 252 during separation (singulation) of the individual IPMs. Any standard laminate singulation process can be used to separate the IPMs such as milling, cutting, sawing, etc. as indicated by the downward facing arrow in FIG. 9.

FIG. 10 shows one of the IPMs after the separation (singulation) process. The flexible connection 104 integrally formed between the embedded power semiconductor module 100 and the logic PCB 102 mechanically connects the embedded module 100 to the logic PCB 102 and provides an electrical pathway between the embedded module 100 and the logic PCB 102 as previously described herein. The logic die(s) 118 and any additional components 120 can be mounted to the patterned metal foil 250 on the top surface 103 of the logic PCB 102, and additional components 112 can be mounted to the same patterned metal foil 250 over the embedded power semiconductor module 100 e.g. as shown in FIGS. 1 and 2.

FIG. 11 illustrates a sectional view of another embodiment of an IPM. According to this embodiment, the embedded power semiconductor module 100 is formed as part of the lamination process used to fabricate the logic PCB 102. The integral flexible connection 104 between the embedded power semiconductor module 100 and the logic PCB 102 is formed by standard precision milling that involves thinning the laminate in a region 244 between the embedded power semiconductor die(s) 106 and the logic PCB 102.

Figure 13:
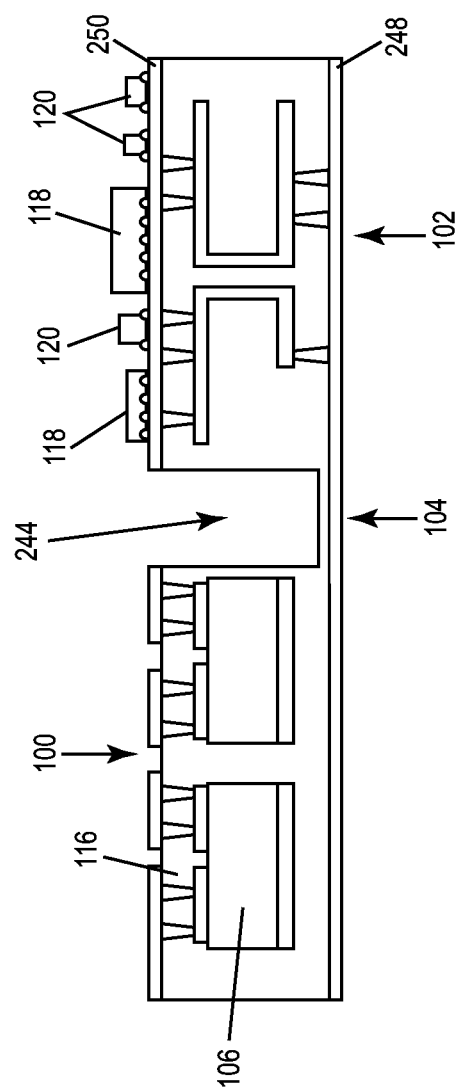
FIG. 13 illustrates a sectional view of still another embodiment of an integrated power module that has a flexible connection integrally formed between an embedded power semiconductor module and a logic printed circuit board.

FIGS. 12 and 13 illustrate sectional views of yet additional embodiments of an IPM. The embodiments shown in FIGS. 11-13 are similar except different electrical connections are formed to the power semiconductor die(s) 106 encased within the embedded power semiconductor module 100. In general, any desired electrical connections can be formed within the embedded power semiconductor module 100 and the logic PCB 102, and between the embedded module 100 and logic PCB 102 by patterning the corresponding metal foils of the laminate substrates and forming corresponding via connections as is standard practice in the semiconductor packaging arts.

FIGS. 14 through 17 illustrate another embodiment of manufacturing the IPM. According to this embodiment, the embedded power semiconductor module 100 is a pre-laminated inlaid module. The integral flexible connection 104 between the embedded power semiconductor module 100 and the logic PCB 102 is formed by providing a laminate that includes the logic PCB 102 and the inlaid embedded power semiconductor module 100 interposed between first and second lamination substrates such that a dielectric-filled gap exists between the logic PCB 102 and power module inlay 100. The laminate is then thinned in a region of the dielectric-filled gap such that the thinned region of the laminate forms the integral flexible connection 104.

Figure 14:
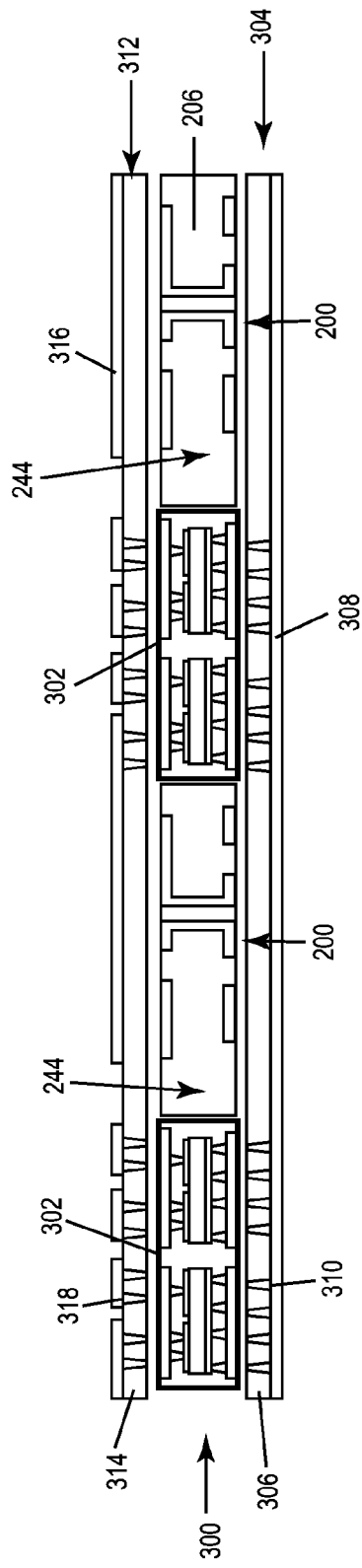
FIGS. 14 through 17 illustrate different stages of another embodiment of a method of interconnecting power electronic circuitry with logic circuitry using an integrated power module.

FIG. 14 shows a panel 300 with pre-laminated power semiconductor module inlays 302 and respective logic PCB cores 200 being arranged on a first lamination substrate 304 such that a dielectric-filled gap 244 remains between the respective logic PCB cores 200 and the power semiconductor module inlays 302. According to this embodiment, the gap 244 between the logic PCB cores 200 and the power semiconductor module inlays 302 is filled with the dielectric material 206 of the logic PCB cores 200. The first lamination substrate 304 comprises a dielectric material 306 such as polytetrafluoroethylene, FR-4, FR-1, CEM-1, CEM-3, polyimide, liquid crystal polymer, etc. laminated with a metal foil 308. The metal foil 308 can be patterned, and conductive vias 310 can extend from the metal foil 308 to the opposite side of the dielectric material 306 to form desired electrical connections with the power semiconductor module inlays 302 and respective logic PCB cores 200. A second lamination substrate 312 is similarly arranged on the logic PCB cores 200 and the power semiconductor module inlays 302 to form a stack that includes the logic PCB and power semiconductor module inlays 200, 302 interposed between the first and second lamination substrates 304, 312. The second lamination substrate 312 comprises a dielectric material 314 such as polytetrafluoroethylene, FR-4, FR-1, CEM-1, CEM-3, polyimide, liquid crystal polymer, etc. laminated with a metal foil 316. The metal foil 316 can be patterned, and conductive vias 318 can extend from the metal foil 316 to the opposite side of the dielectric material 314 to form desired electrical connections with the power semiconductor module inlays 302 and respective logic PCB cores 200. The lamination substrates 304, 312 can include any standard dielectric 306, 314 such as polytetrafluoroethylene, FR-4, FR-1, CEM-1, CEM-3, polyimide, liquid crystal polymer, etc. laminated with one or more respective metal foils 308, 316.

Figure 15:
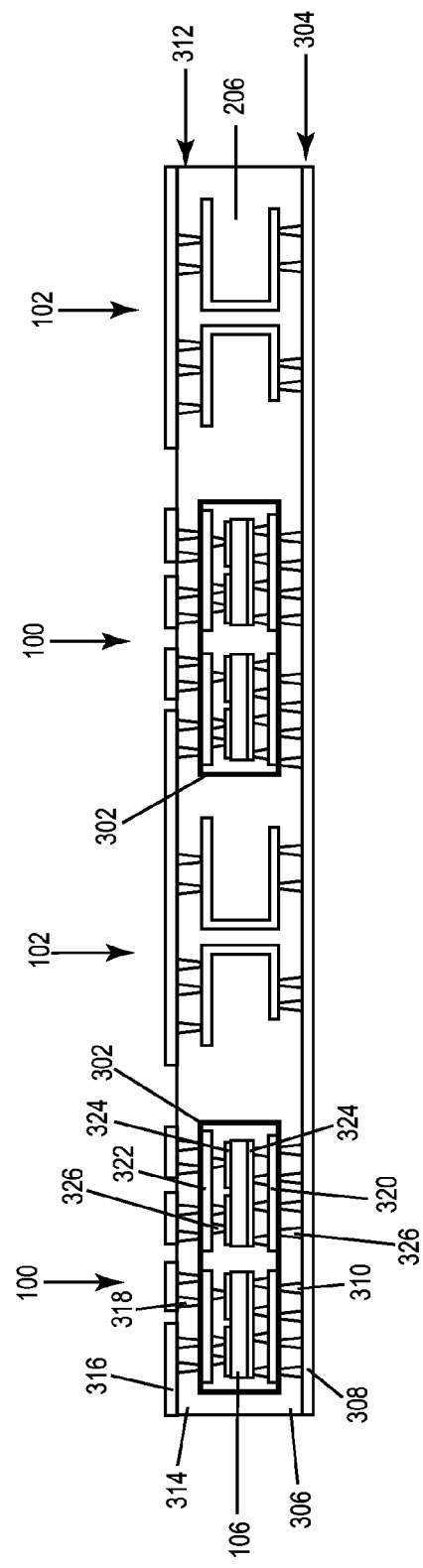

FIG. 15 shows the structure after the stack is laminated. One or both of the lower and upper metal foils 308, 316 can be patterned, and respective conductive vias 310, 318 can extend to metallization 320, 322 corresponding terminals 320, 322 of the inlaid power semiconductor modules 302. Electrical connections can be completed to terminals 324 on the power semiconductor die(s) 106 embedded in the inlaid power semiconductor modules 302 through respective internal via connections 326 within the inlaid power semiconductor modules 302.

Figure 16:
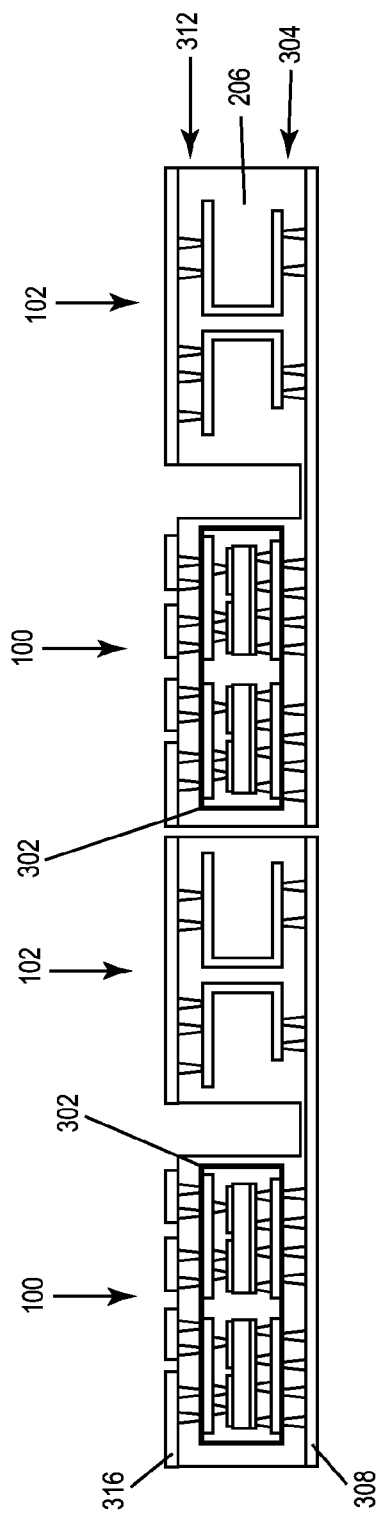

FIG. 16 shows the laminated structure after milling through the second lamination substrate 312 and the dielectric-filled gap 244 between adjacent logic PCBs 102 and inlaid power semiconductor modules 100, and after separation (singulation) of the individual IPMs. Any standard milling and separation (singulation) processes can be used as previously described herein.

Figure 17:
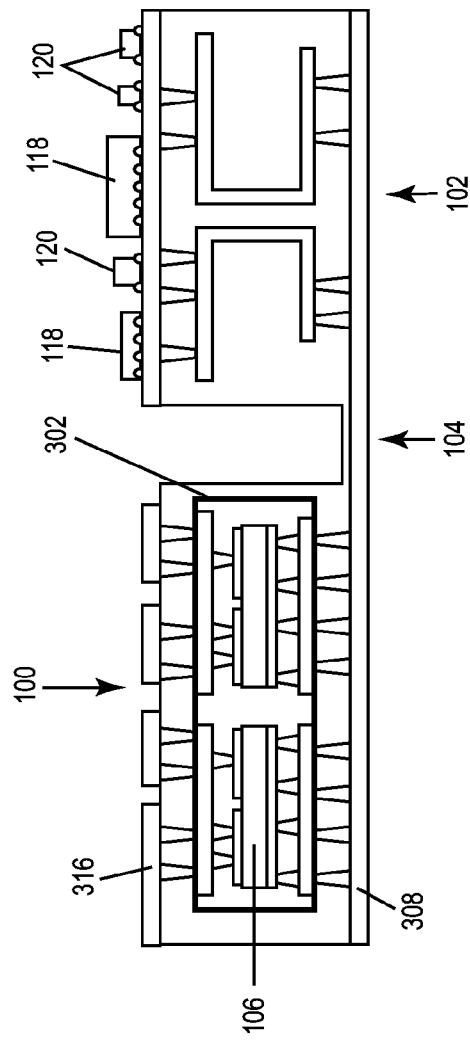

FIG. 17 shows one of the IPMs after the separation (singulation) process. The flexible connection 104 integrally formed between the inlaid power semiconductor module 100 and the logic PCB 102 mechanically connects the inlaid power module 100 to the logic PCB 102 and provides an electrical pathway between the inlaid power module 100 and the logic PCB 102 as previously described herein. Logic die(s) 118 and any additional components 120 can be mounted to the patterned metal foil 316 on the top surface of the logic PCB 102, and additional components (not shown in FIG. 17) can be mounted to the same patterned metal foil 316 over the inlaid power semiconductor module 100 if desired.

The IPMs described herein combine high-density logic PCBs with embedded power semiconductor modules using an integral flexible connection approach which allows for 3D system design (e.g. folding, stacking), simplifies the assembly process by using a single PCB board concept, lowers overall IPM cost while offering separately optimized technologies for high-density PCB and embedded power semiconductor modules, and allows for IPM module miniaturization (shrinking).

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated power module with integrated power electronic circuitry and logic circuitry, comprising:
    a first lamination substrate comprising a dielectric material laminated with a metal foil;
    an embedded power semiconductor module on the first lamination substrate and including one or more power semiconductor dies embedded in a dielectric material;
    a multi-layer logic printed circuit board (PCB) core on the first lamination substrate and spaced apart from the embedded power semiconductor module;
    a second lamination substrate comprising a dielectric material laminated with a metal foil, the second lamination substrate covering the embedded power semiconductor module and the multi-layer logic PCB core;
    a recess formed in a dielectric-filled gap between the power semiconductor module and the multi-layer logic PCB core, the recess extending through the second lamination substrate and the dielectric-filled gap to or into the first lamination substrate; and
    a flexible connection integrally formed between the embedded power semiconductor module and the multi-layer logic PCB core, the flexible connection mechanically connecting the embedded power semiconductor module to the multi-layer logic PCB core and providing an electrical pathway between the embedded power semiconductor module and the multi-layer logic PCB core, the flexible connection formed from a region of the first lamination substrate exposed by the recess.

2. The integrated power module of claim 1, wherein the flexible connection is bent such that the multi-layer logic PCB core lies in a different plane than the embedded power semiconductor module.

3. The integrated power module of claim 2, wherein the flexible connection is bent such that the multi-layer logic PCB core lies in a plane that is perpendicular to the plane in which the embedded power semiconductor module lies.

4. The integrated power module of claim 1, wherein the flexible connection is bent such that the multi-layer logic PCB core is positioned over or under the embedded power semiconductor module.

5. The integrated power module of claim 1, wherein the electrical pathway provided by the integral flexible connection is formed by the metal foil of the first lamination substrate.

6. The integrated power module of claim 1, further comprising one or more logic dies mounted to a surface of the metal foil of the second lamination substrate over the multi-layer logic PCB core.

7. The integrated power module of claim 6, wherein the flexible connection is bent such that the one or more logic dies face toward the embedded power semiconductor module.

8. A power module, comprising:
a first metal foil;
a first dielectric material laminated on the first metal foil;
an embedded power semiconductor module on the first dielectric material and including one or more power semiconductor dies;
a multi-layer logic printed circuit board (PCB) core on the first dielectric material and spaced apart from the embedded power semiconductor module;
a second dielectric material covering the embedded power semiconductor module and the multi-layer logic PCB core;
a second metal foil over the second dielectric material, the second dielectric material being laminated on the second metal foil; and
a recess formed in a dielectric-filled gap between the power semiconductor module and the multi-layer logic PCB core, the recess extending through the second metal foil, the second dielectric material and the dielectric-filled gap to or into the first dielectric material so as to expose a region of the first dielectric material,
wherein the region of the first dielectric material exposed by the recess and a region of the first metal foil covered by the exposed region of the first dielectric material form a flexible electrical connection between the embedded power semiconductor module and the multi-layer logic PCB core.

9. The power module of claim 8, wherein the flexible electrical connection is bent such that the multi-layer logic PCB core lies in a different plane than the embedded power semiconductor module.

10. The power module of claim 9, wherein the flexible electrical connection is bent such that the multi-layer logic PCB core lies in a plane that is perpendicular to the plane in which the embedded power semiconductor module lies.

11. The power module of claim 8, wherein the flexible electrical connection is bent such that the multi-layer logic PCB core is positioned over or under the embedded power semiconductor module.

12. The power module of claim 8, further comprising one or more logic dies mounted to a surface of the second metal foil over the multi-layer logic PCB core.

13. The power module of claim 12, wherein the flexible electrical connection is bent such that the one or more logic dies face toward the embedded power semiconductor module.

* * * * *